United States Patent
Kim et al.

(10) Patent No.: US 6,790,780 B2
(45) Date of Patent: Sep. 14, 2004

(54) FABRICATION OF 3-D CAPACITOR WITH DUAL DAMASCENE PROCESS

(75) Inventors: Sarah E. Kim, Portland, OR (US); R. Scott List, Beaverton, OR (US); Bruce A. Block, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 324 days.

(21) Appl. No.: 09/965,972

(22) Filed: Sep. 27, 2001

(65) Prior Publication Data

US 2003/0060052 A1 Mar. 27, 2003

(51) Int. Cl.[7] .............................................. H01L 21/302
(52) U.S. Cl. ........................ 438/692; 438/694; 438/696; 438/700; 438/702
(58) Field of Search ................................ 438/692, 694, 438/696, 700, 702

(56) References Cited

U.S. PATENT DOCUMENTS

| | | | |
|---|---|---|---|
| 6,166,423 A | * 12/2000 | Gambino et al. | 257/532 |
| 6,239,021 B1 | * 5/2001 | Pramanick et al. | 438/627 |
| 6,320,244 B1 | * 11/2001 | Alers et al. | 257/534 |
| 6,346,741 B1 | * 2/2002 | Van Buskirk et al. | 257/664 |

* cited by examiner

Primary Examiner—Nadine G. Norton
Assistant Examiner—Binh X. Tran
(74) Attorney, Agent, or Firm—Blakely, Sokoloff, Taylor & Zafman LLP

(57) ABSTRACT

A three dimensional capacitor fabricated as part of a dual damascene process is disclosed. The capacitor structure comprises two barrier metal layers separated by a high k dielectric and is formed in all the via and trench openings. The upper barrier layer and dielectric is selectively removed from those openings which will have ordinary vias and conductors, the other opening remains as capacitor.

16 Claims, 3 Drawing Sheets

FABRICATION OF 3-D CAPACITOR WITH DUAL DAMASCENE PROCESS

FIELD OF INVENTION

The invention relates to the field of capacitors in an integrated circuit.

PRIOR ART

On-chip decoupling capacitors are helpful in compensating for the voltage drop associated with power grid inductance, particularly for high surge current conditions. The inclusion of these capacitors on-chip as opposed to off-chip greatly reduces the affects of the inductance and provides decoupling for higher frequency noise.

In many current semiconductor processes, copper is used as an interconnect material. Often a damascene or dual damascene process is used to form the copper interconnects because of the difficulty in etching copper. As will be seen, the present invention lends itself to fabricating capacitors in conjunction with a dual damascene process.

A dual damascene process for fabricating copper interconnects is disclosed in U.S. patent application Ser. No. 09/746,035, entitled "Method for Making A Dual Damascene Interconnect Using a Multilayer Hard Mask," filed Dec. 22, 2000 and assigned to the assignee of the present application.

DETAILED DESCRIPTION

Figure 1:
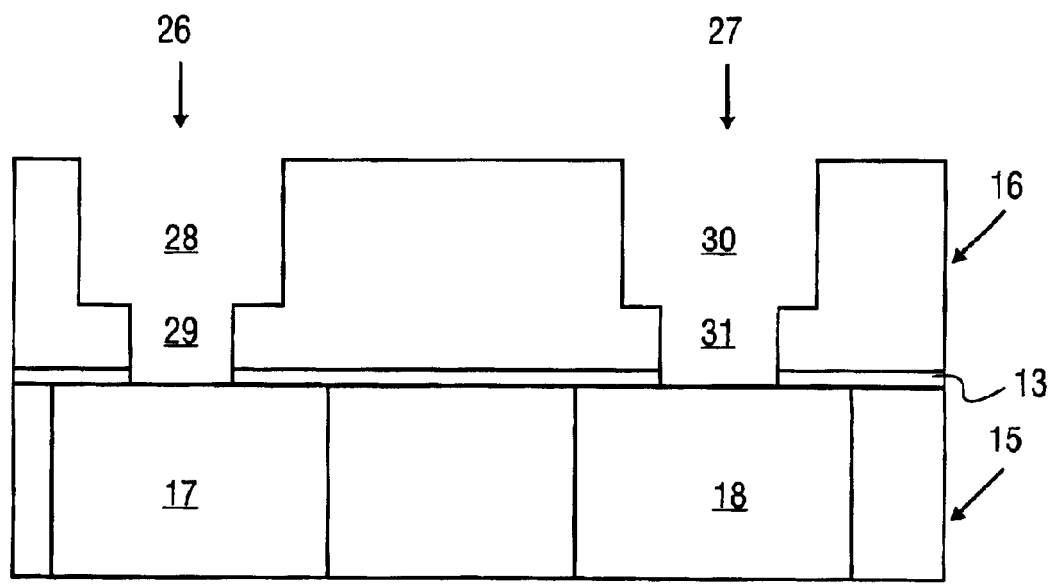
FIG. 1 is a cross-sectional elevation view of a metalization layer and a overlying etched dielectric layer.

A capacitor and method for fabricating the capacitor particularly useful in connection with a dual damascene process is described. In the following description, numerous specific details are set forth such as specific processing steps and specific chemistries. It will be apparent to one skilled in the art that the present invention may be practiced without these specific details. In other instances, well-known fabrication steps such as masking and etching steps are not described in detail in order not to unnecessarily to obscure the present invention.

In the drawings, the orientation of the conductors from one layer to the next are shown as being parallel in order to simplify the drawings. In practice, the conductors in one layer may be orthogonal to the conductors in the next layer.

In the following description, openings in an interlayer dielectric (ILD) are illustrated which include a via and a trench. One of the vias and trenches shown in the drawings discussed below are used for a capacitor, the other for an interconnect. The portion of the interconnect structure which includes only the trench (or conductor when filled) is not illustrated in the drawings. It will be apparent, to one skilled in the art, that the processing described below is also used to form these conductors. In this case, only the trench is etched (without the via) and the remaining processing occurs as shown below.

Figure 8:
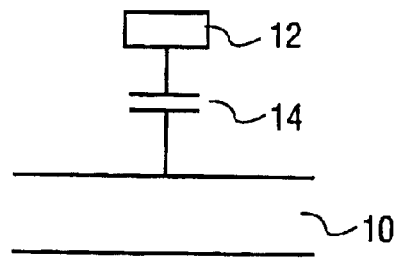
FIG. 8 illustrates two conductors and a capacitor.

Referring briefly to FIG. 8, a capacitor 14 is shown in schematic form between an underlying conductor 10 and overlying conductor 12. The conductor 10 is fabricated in a first ILD while the conductor 12 is fabricated in an overlying ILD. The capacitor 14, as will be seen with the present invention, is fabricated between these conductors. While the capacitors may be fabricated in any ILD level, in one embodiment they are fabricated in the upper most level. For instance, in a six layer metalization process, they are fabricated between the fifth and sixth metal layers. Additionally, while the capacitors may be used in many different electrical applications in which capacitors are used, in one embodiment they are used, as mentioned previously, to compensate for inductance and to reduce noise. Thus, for instance, the capacitor 14 may be coupled between an overlying power line and an underlying ground line.

OVERVIEW OF THE PRESENT INVENTION

The present invention results in a three dimensional (3-D) capacitor in connection with a dual damascene process. Vias and trenches are first formed in an interlayer dielectric (ILD). These openings are then lined with a structure which forms a capacitor. The structure includes at least two conductive barrier layers separated by a dielectric layer, preferably a high k dielectric. Masking and etching steps are used to remove at least part of the capacitor structure from those openings which are to be used for interconnections to an underlying interconnect level. For instance, the upper barrier layer and high k dielectric are etched in these selected openings. Overlying metal is formed, such as a copper layer in all the openings, and a planarization step completes the interconnect structure and capacitors.

DESCRIPTION OF AN EMBODIMENT

Referring now to FIG. 1, a first ILD 15 is shown which includes conductors 17 and 18. This ILD is covered with a dielectric layer 13 used as an etching stop and may be fabricated from, for instance, silicon nitride ($Si_3N_4$). Ideally, the conductors 17 and 18 are fabricated in a low k dielectric to reduce the capacitors between the conductors. Such low k dielectrics are not ideal, however, for capacitors such as the capacitor 14 of FIG. 8. The low k dielectrics used for the layer 15 and also for the layer 16 may be a carbon-doped oxide or a polymer based dielectric or other low density dielectrics. As will be seen, this material is not used as the dielectric in the capacitor.

After the completion of the interconnection in the ILD 15, the ILD 16 is formed on the layer 13. Using ordinary photolithographic processing, openings such as openings 26 and 27 are formed in the dielectric layer 16. The specific openings shown in FIG. 1 is the opening 26 having a via 29 and a trench 28. The opening 27 includes a via 31 and a trench 30. As mentioned, trenches between vias are typically also found in the layer but not shown.

After the vias 29 and 31 of FIG. 1 have been etched, the layer 13 which is typically used as an etching stop, is removed exposing the underling conductors 17 and 18. The subsequent deposition of the first conductive barrier layer is in contact with these underlying conductors.

Figure 3:
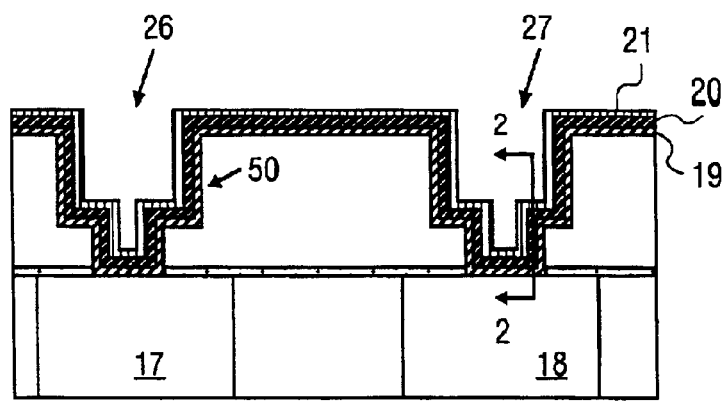
FIG. 3 illustrates the structure of FIG. 1 after several layers have been formed in one embodiment of the present invention.

Now, a capacitor structure is formed on the upper surface of layer 16 and within the openings 26 and 27. For instance, a first conductive barrier layer 19 is formed as shown in FIG. 3, followed by the deposition of a high k dielectric 20 and the formation of a second conductive barrier layer 21. The resultant structure is a capacitor in that it includes a dielectric disposed between an underlying and overlying metal layer. Note that the capacitor structure is formed in all the openings in the ILD 16 and on all exposed surfaces of the layer 16 for the described embodiment.

The dielectric layer 20, as mentioned, is preferably a high k dielectric. In one embodiment, silicon nitride is used as the dielectric with a thickness in the range of 30 to 50 Å. In another embodiment, a relatively thick silicon nitride layer is used having a thickness of approximately 200 Å. Another dielectric that can be used in oxides of titanium, again, having a thickness of 30–50 Å. Other high dielectric materials that may be used are tantalum penta oxide ($TaO_5$), barrion-stratium-titanate (BST) or lead-zirconium-titanate (PZT). For these higher k materials such as BST, a thicker layer of dielectric may be used, for example 75–150 Å of BST.

The conductive barrier layers may be fabricated from typical barrier layer material such as tantalum (Ta), tantalum nitride (TaN) or a stack comprising tantalum and tantalum nitride.

Figure 2:
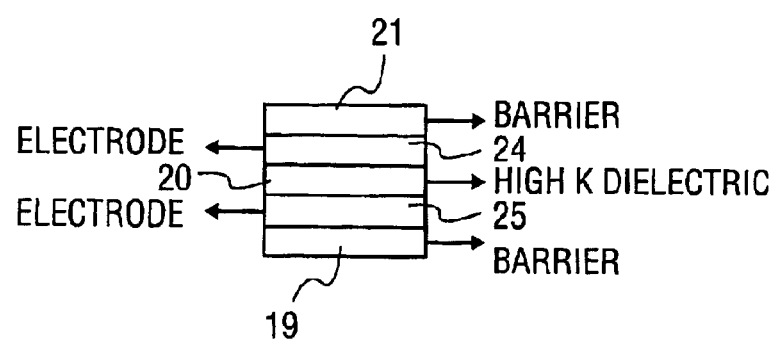
FIG. 2 is a cross-sectional view of several layers used in one embodiment of the present invention taken through section line 2—2 of FIG. 3.

In some cases, the higher dielectric materials may not be formed on, or compatible with, a tantalum barrier material. For this reason, an electrode layer may be needed between the barrier layer and the dielectric layer. In FIG. 2, an electrode layer 25 is shown between the lower barrier layer 19 and the dielectric 20 and a second electrode layer 24 between the upper barrier layer 21 and the dielectric 20. For instance, where BST is used as the dielectric, the electrode material used is ruthenium (Ru) or iridium (Ir).

Figure 4:
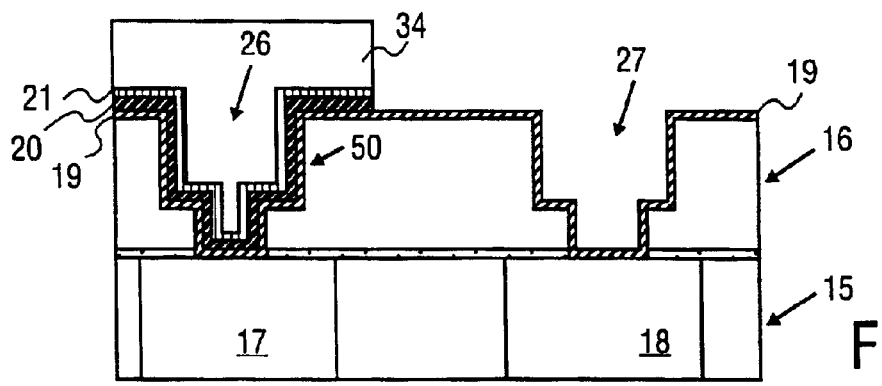
FIG. 4 illustrates the structure of FIG. 3 after a masking step and several etching steps.

Referring now to FIG. 4, a masking step is used to mask over those openings which are to remain as capacitors. The other openings which are to include vias and conductors are left exposed as are surrounding regions of the upper surface of layer 16. Thus, as shown in FIG. 4, the photoresist layer 34 covers the capacitor structure 50 whereas the opening 27 is exposed. Etching steps are used to etch and remove the exposed layers 21 and the then layer 20. The lower barrier layer 19 is left in place and used as a barrier/seed layer for subsequent metalization such as for a copper plating step. The resultant structure of FIG. 4 illustrates that the opening 27 includes only the barrier layer 19 whereas the opening 26, protected by the masking member 34, includes the capacitor structure 50.

Figure 5:
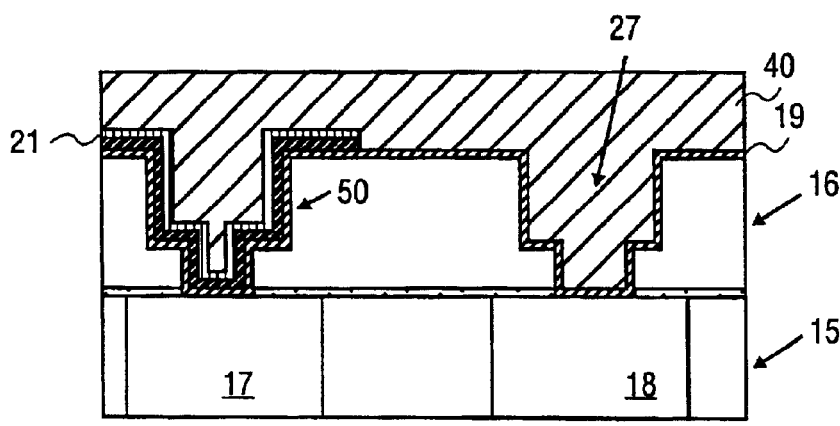
FIG. 5 illustrates the structure of FIG. 4 after a metalization step.

Now, referring to FIG. 5, a metalization step is used to form the metal 40. A conventional copper electroplating process may be used to form a copper or copper alloy metal as is done in one embodiment. Other conductive layers may be formed from various other materials. Note that the layer 19 acts as a barrier to the diffusion of copper within the opening 27. In contrast, the second conductive barrier layer 21 acts as the barrier to the diffusion of copper for the capacitor structure 50. Thus, the copper does not diffuse into either the high k dielectric of the capacitor or the low k ILD.

Now, an ordinary chemical-mechanical polishing (CMP) step is used to planarize the upper surface of layer 16 and remove the copper and other layers which overlie the layer 16. While for the embodiment shown, a hard mask is not used as an etching stop for this planarization step, one may be incorporated into the process. The resultant structure of FIG. 6 includes the capacitor structure 50 and a conductor contact 40. Note the capacitor structure 50 is a single 3-D capacitor disposed between a conductor in ILD 16 and a conductor in layer 15.

Figure 6:
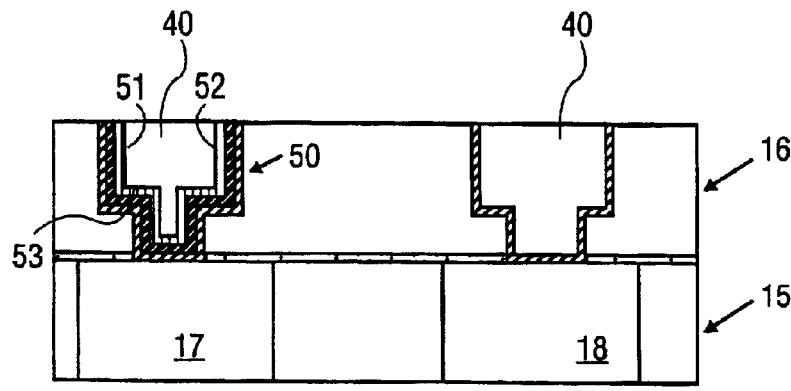
FIG. 6 illustrates the structure of FIG. 5 after a planarization step.
Figure 9:
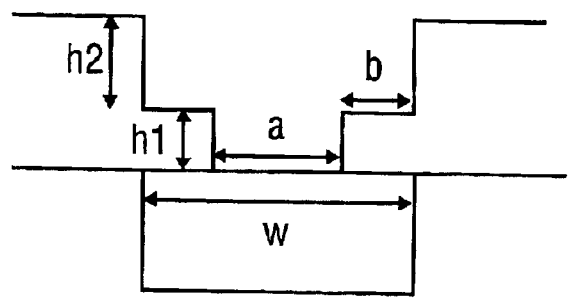
FIG. 9 illustrates a via and trench, this figure is used to show various dimensions associated with a capacitor for one embodiment of the present invention.

The 3-D capacitor 50 of FIG. 6 includes a pair of step sidewalls 51 and 52 facing each other with a horizontal portion 53 in each of the step sidewalls. This provides a relatively substantial amount of area depicted in FIG. 9. As can be seen, the stepped sidewalls include a height "$h_1$" and "$h_2$" and a flat region shown having the dimension "b". Additionally, capacitance is obtained from that would ordinarily be the via contact area having a dimension "a."

Recall that capacitance is equal to $$C = \frac{\epsilon_0 \epsilon A}{d}$$

where $\epsilon_O$ is the free space permitivity, $\epsilon$ is dielectric constant, A is area, and d is the dielectric film thickness. Assume that $A_1$ is the area for a planar capacitor fabricated in the base of the opening having a dimension "W" of FIG. 9. Assume further that an $A_2$ is the area of the 3-D capacitor of the present invention which includes the areas form by $h_1$, $h_2$, a and b of FIG. 9. Then, the capacitance ratio of a planar capacitor and a capacitor fabricated in accordance with the present invention would be $$\frac{C2}{C1} = \frac{A2}{A1}$$

(where $h_1+h_2$ is the ILD height and W is the width of the metal layer). Where W is equal to one micron, and $h_1+h_2$ equal to 1.5 microns, the ratio of $$\frac{A2}{A1}$$

is 4. With $h_1+h_2$ equal to 1.8 microns, the ratio of $$\frac{A2}{A1}$$

is 4.6. This assumes the length of both the planar and 3-D capacitor are the same. Consequently, with the 3-D capacitor of the present invention, improvements in capacitance of 4×are possible when compared to a planar capacitor.

Figure 7:
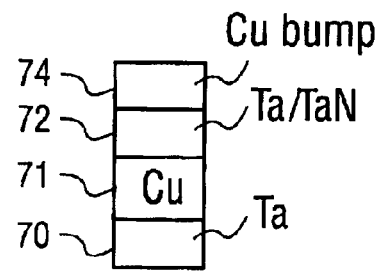
FIG. 7 illustrates several layers used in the upper most interconnect layer.

Referring briefly to FIG. 7, as mentioned, in one embodiment the capacitor 14 of FIG. 8 is fabricated between the upper most metal layer and the underlying metal layer such as between metal layers 5 and 6 in a 6-layer metal process When this is done, as shown in FIG. 7, the copper layer 71 is fabricated over a barrier layer 70. The barrier 70 in the capacitor is the second barrier layer as discussed above whereas in the via and conductor regions, it is the only barrier layer 19. The copper layer 71 of FIG. 7 corresponds to the layer 40 shown in FIG. 5. For processing on the upper most metal layer, and adhesion layer such as a tantalum or tantalum nitride or stack of layers 72 is used. Then, an additional copper layer 74 is used to form, for instance, bumps used as part of the packaging and contact mechanism for providing contact to the integrated circuit from a printed circuit board.

Thus, a three dimensional capacitor fabricated in conjunction with a dual damascene process has been described. The 3-D capacitor provides, for example, 4× the capacitance that would be expected from a planar capacitor fabricated between the metal layers.

What is claimed:

1. A method for fabricating capacitors, vias, and conductors in an interlayer dielectric (ILD) comprising:

forming a plurality via and overlying trench in the ILD;

depositing a first conductive barrier layer so as to line the vias and trenches;

depositing a dielectric layer over the first conductive barrier layer;

depositing a second conductive barrier layer over the dielectric layer;

covering at least some of the vias and overlying trenches;

removing the second conductive barrier layer and dielectric layer from the vias and overlying trenches not covered;

filling the vias and trenches with a conductive material that includes copper; and polishing back the conductive material so as to expose the ILD adjacent to the trench.

2. The method defined by claim 1 wherein at least one of the first and second barrier layers comprises tantalum.

3. The method defined by claim 1 wherein the dielectric layer is selected from the group consisting of silicon nitride, titanium oxide, tantalum penta oxide, and barium-strontium-titanate.

4. The method defined by claim 1 including the deposition of conductive electrode layers between the first conductive barrier layer and the dielectric layer and between the dielectric layer and the second conductive barrier layer.

5. The method defined by claim 4 wherein the electrode layers comprise a material selected from the group consisting of ruthenium and iridium.

6. The method defined by claim 1 wherein the vias expose underlying conductors.

7. In a dual damascene process an improvement comprising:

lining vias and trenches in an ILD with a first and second conductive barrier layer having a dielectric disposed there between;

removing the second barrier layer and dielectric from selected ones of the vias and trenches; and forming a conductive material in the vias and trenches.

8. The process defined by claim 7 wherein the dielectric is selected from the group consisting of silicon nitride, titanium oxide, and barium-strontium-titanate.

9. The process defined by claim 7 wherein the first and second conductive barrier layer comprises tantalum.

10. The process defined by claim 7 wherein electrode layers are used between the barrier layers and the conductive material.

11. The process defined by claim 7 where the first barrier layer is in contact with an underlying conductor.

12. A method for fabricating capacitors and via interconnects in an interlayer dielectric (ILD) comprising:

forming a plurality of vias and overlying trenches;

forming a capacitor structure which includes a dielectric layer on the ILD and within the vias and trenches;

removing the dielectric layer from the capacitor structure from selected vias and trenches, leaving a first conductive barrier layer in the selected vias and trenches;

forming a conductive material in the vias and trenches such that some of the vias and trenches have capacitors and others have interconnects.

13. The method defined by claim 12 wherein forming a conductive material comprises forming a copper layer and polishing the copper layer after removing the dielectric layer from the capacitor structures in the selected vias and trenches.

14. The method defined by claim 13 wherein the polishing step includes removing all material on the ILD between the trenches.

15. The method defined by claim 13 wherein the step of forming the capacitor structure comprises the steps of forming the first conductive barrier layer, forming the dielectric layer and forming a second conductive barrier layer.

16. The method defined by 15 including adding electrode layers between the barrier layers and the dielectric layer.

* * * * *

UNITED STATES PATENT AND TRADEMARK OFFICE
CERTIFICATE OF CORRECTION

PATENT NO. : 6,790,780 B2
DATED : September 14, 2004
INVENTOR(S) : Kim et al.

It is certified that error appears in the above-identified patent and that said Letters Patent is hereby corrected as shown below:

Column 3,
Line 21, before "oxides", delete "in" and insert -- is --.

Signed and Sealed this

Fifteenth Day of February, 2005

JON W. DUDAS
*Director of the United States Patent and Trademark Office*